(12) United States Patent
Choi

(10) Patent No.: US 7,477,543 B2
(45) Date of Patent: Jan. 13, 2009

(54) FLASH MEMORY DEVICE WITH PROGRAM CURRENT COMPENSATION

(75) Inventor: Jeong-un Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/624,778

(22) Filed: Jan. 19, 2007

(65) Prior Publication Data

US 2007/0171727 A1    Jul. 26, 2007

(30) Foreign Application Priority Data

Jan. 20, 2006    (KR) ................. 10-2006-0006451

(51) Int. Cl.
*G11C 11/34* (2006.01)
(52) U.S. Cl. .................. 365/185.03; 365/200
(58) Field of Classification Search ............ 365/185.03, 365/200
See application file for complete search history.

(56) References Cited

U.S. PATENT DOCUMENTS

| | | | |
|---|---|---|---|
| 4,644,250 A | 2/1987 | Hartgring | |
| 5,353,256 A | 10/1994 | Fandrich et al. | |
| 7,176,751 B2* | 2/2007 | Giduturi et al. | 327/540 |
| 7,269,068 B2* | 9/2007 | Chae et al. | 365/185.18 |
| 2001/0004325 A1* | 6/2001 | Choi | 365/185.14 |
| 2002/0101778 A1* | 8/2002 | Khan | 365/230.03 |
| 2006/0291285 A1* | 12/2006 | Mokhlesi et al. | 365/185.18 |
| 2007/0171708 A1* | 7/2007 | Tedrow et al. | 365/185.03 |

FOREIGN PATENT DOCUMENTS

| | | |
|---|---|---|
| KR | 1020010011501 A | 2/2001 |
| KR | 1020050020865 A | 3/2005 |

OTHER PUBLICATIONS

Notice of Examination Report, Korean Application No. 10-2006-0006451, Nov. 7, 2006.

* cited by examiner

*Primary Examiner*—Michael T Tran
(74) *Attorney, Agent, or Firm*—Myers Bigel Sibley & Sajovec, P.A.

(57) ABSTRACT

A memory device includes a flash memory cell array comprising a plurality of flash memory cells, a program voltage generator circuit configured to generate a program voltage at an output thereof and a program circuit coupled to the output of the program voltage generator circuit and configured to couple the output of the program voltage generator circuit to the memory cell array. The memory cell array responsively loads the output of the program voltage generator circuit an amount that varies in correlation with data applied to the memory cell array. The device further includes a program current compensator circuit coupled to the output of the program voltage generator circuit and configured to load the program voltage generator circuit in correlation to the data applied to the memory cell array.

22 Claims, 9 Drawing Sheets

FLASH MEMORY DEVICE WITH PROGRAM CURRENT COMPENSATION

CROSS REFERENCE TO RELATED APPLICATION

This application claims priority from Korean Patent Application No. 10-2006-0006451 filed on Jan. 20, 2006 in the Korean Intellectual Property Office, the disclosure of which is incorporated herein by reference in its entirety.

FIELD OF THE INVENTION

The present invention relates to memory devices and methods of operation thereof and, more particularly, to flash memory devices and methods of operation thereof.

BACKGROUND OF THE INVENTION

A flash memory device typically performs programming, reading and erasing operations. In order to perform these operations, different bias conditions are typically applied to the flash memory cells of the device.

In particular, typical program bias conditions of a split gate flash memory cell are as follows. Because the split gate flash memory cell may use a source side hot carrier injection method, a voltage of about a threshold voltage Vt, for example, about 1 V, may be applied to a word line that is coupled to the gate of the split gate flash memory cell to be programmed. A predetermined voltage (for example, about 0.4 V) may be applied to a bit line that is coupled to the drain of the split gate flash memory cell to be programmed. A raised program voltage Vpp may be applied to a source line that is coupled to the source of the split gate flash memory cell to be programmed. Accordingly, program current flows from the source line to the bit line when programming is performed.

However, when the number of simultaneously programmed split gate flash memory cells is large, a total program current may be of such magnitude that the level of the program voltage applied to the source line may decrease. As a result, program efficiency may be lowered.

If the voltage level of the program voltage is increased to compensate for the total program current, a disturb phenomenon may occur in which adjacent split gate flash memory cells opposite to each other on the source line are programmed, even when they should not programmed. If the number of split gate memory cells to be simultaneously programmed is small (for example, one or two), the program voltage may not fall, and the adjacent split gate flash memory cells may be directly affected by the program voltage.

SUMMARY OF THE INVENTION

In some embodiments of the present invention, a memory device includes a flash memory cell array comprising a plurality of flash memory cells, a program voltage generator circuit configured to generate a program voltage at an output thereof and a program circuit coupled to the output of the program voltage generator circuit and configured to couple the output of the program voltage generator circuit to the memory cell array. The memory cell array responsively loads the output of the program voltage generator circuit an amount that varies in correlation with data applied to the memory cell array. The device further includes a program current compensator circuit coupled to the output of the program voltage generator circuit and configured to load the program voltage generator circuit in correlation to the data applied to the memory cell array. The program current compensator circuit may be configured to provide a load at the output of the program voltage generator circuit that is complementary to a load provided by the program circuit. The program current compensator circuit may be configured to maintain a current drawn from the output of the program voltage generator circuit substantially constant over a range of data applied to the memory cell array.

According to some embodiments, the program current compensator circuit comprises a control circuit comprising a plurality of paralleled dummy load circuits that pass respective currents responsive to the applied data. A current mirror circuit is coupled to the output of the program voltage generator circuit and the control circuit and configured to draw a current from the program voltage generator circuit that mirrors a sum of the currents in the plurality of parallel dummy load circuits. In some embodiments, the current mirror circuit may include a first current mirror circuit having a first current path coupled to the output of the program voltage generator circuit, and the control circuit may include a second current mirror circuit having a first current path coupled in series with the plurality of paralleled dummy load circuits and a second current path coupled in series with a second current path of the first current mirror circuit. In further embodiments, the current mirror circuit may have a first current path coupled to the output of the program voltage generator circuit and a second current path coupled in series with the plurality of paralleled dummy load circuits.

In some embodiments of the present invention, respective ones of the paralleled dummy load circuits are controlled responsive to respective data lines of the memory cell array. In further embodiments, respective ones of the paralleled dummy load circuits are controlled responsive to respective pairs of data lines of the memory cell array. The paralleled dummy load circuits may be configured to be enabled and disabled responsive to a program enable signal. The device may include a coupling circuit configured to couple and decouple the current mirror circuit to and from the output of the program voltage generator circuit responsive to a program enable signal. According to further aspects, the paralleled dummy load circuits may be configured to pass current from a power supply node having a voltage less than a voltage produced by the program voltage generator circuit.

According to some embodiments of the present invention, a flash memory device includes a flash memory cell array that has a plurality of flash memory cells, a program current flowing through each of the plurality of flash memory cells in response to input data, a control circuit that has a plurality of dummy program current generating elements, each of dummy program currents having the same amount as the program current flowing through each of the plurality of dummy program current generating elements in response to the input data, and a current mirror circuit supplying a mirror program current that has substantially the same amount as a current corresponding to a sum of the plurality of dummy program currents. A current corresponding to a sum of the plurality of program currents and the mirror program current is constant regardless of the number of flash memory cells to be simultaneously programmed.

According to further embodiments of the present invention, a flash memory device includes a flash memory cell array that has a plurality of flash memory cells defined in regions where word lines, source lines, and bit lines cross one another, each of the plurality of flash memory cells having a gate coupled to the word line, a drain coupled to the bit line, and a source coupled to the source line, a program circuit allowing a plurality of program currents to flow from the source lines applied with a program voltage to the bit lines, in response to a plurality of input data, a control circuit that has a plurality of dummy program current generating elements through which a plurality of dummy program currents flow in response to the plurality of input data, and a current mirror circuit that is electrically coupled to the program voltage, and supplies a mirror program current which has substantially the same amount as a current corresponding to a sum of the plurality of dummy program currents.

According to still further embodiments of the present invention, a flash memory device includes a flash memory cell array that has a plurality of flash memory cells, a program current flowing through each of the plurality of flash memory cells in response to input data, and a control circuit that has a plurality of dummy program current generating elements, each of dummy program currents having the same amount as the program current flowing through each of the plurality of dummy program current generating elements in response to the input data. A current corresponding to a sum of the plurality of program currents and the plurality of dummy program currents is constant regardless of the number of flash memory cells to be simultaneously programmed.

BRIEF DESCRIPTION OF THE DRAWINGS

The above and other features and advantages of the present invention will become more apparent by describing in detail embodiments thereof with reference to the attached drawings, in which.

DESCRIPTION OF EMBODIMENTS

Figure 1:
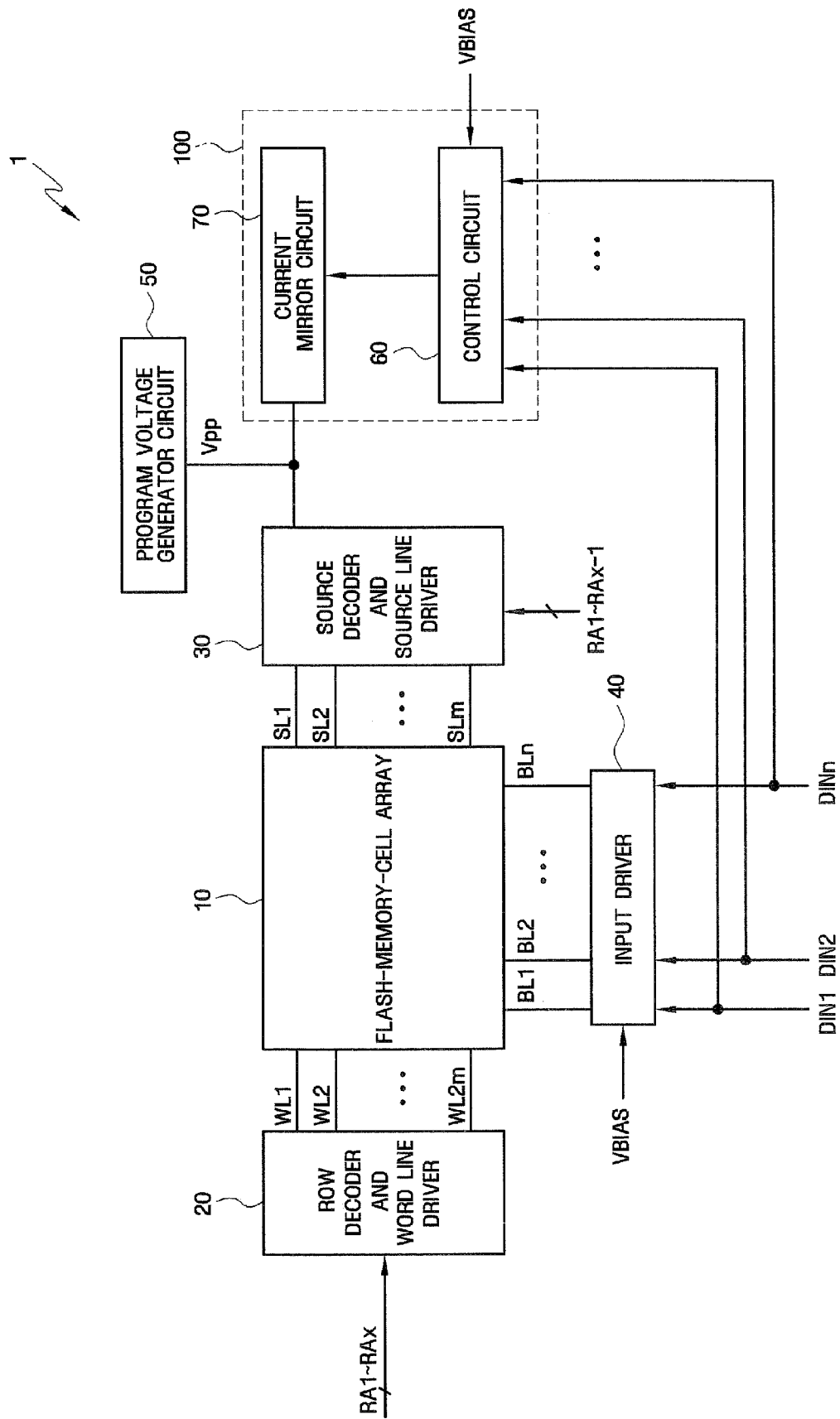
FIG. 1 is a block diagram illustrating a flash memory device according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes or configurations of elements may be idealized or exaggerated for clarity.

It will be understood that when an element is referred to as being "connected to" or "coupled to" another element, it may be directly connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third etc. may be used herein to describe various elements, components and/or sections, these elements, components and/or sections should not be limited by these terms. These terms are only used to distinguish one element, component, or section from another element, region or section. Thus, a first element, component or section discussed below could be termed a second element, component or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
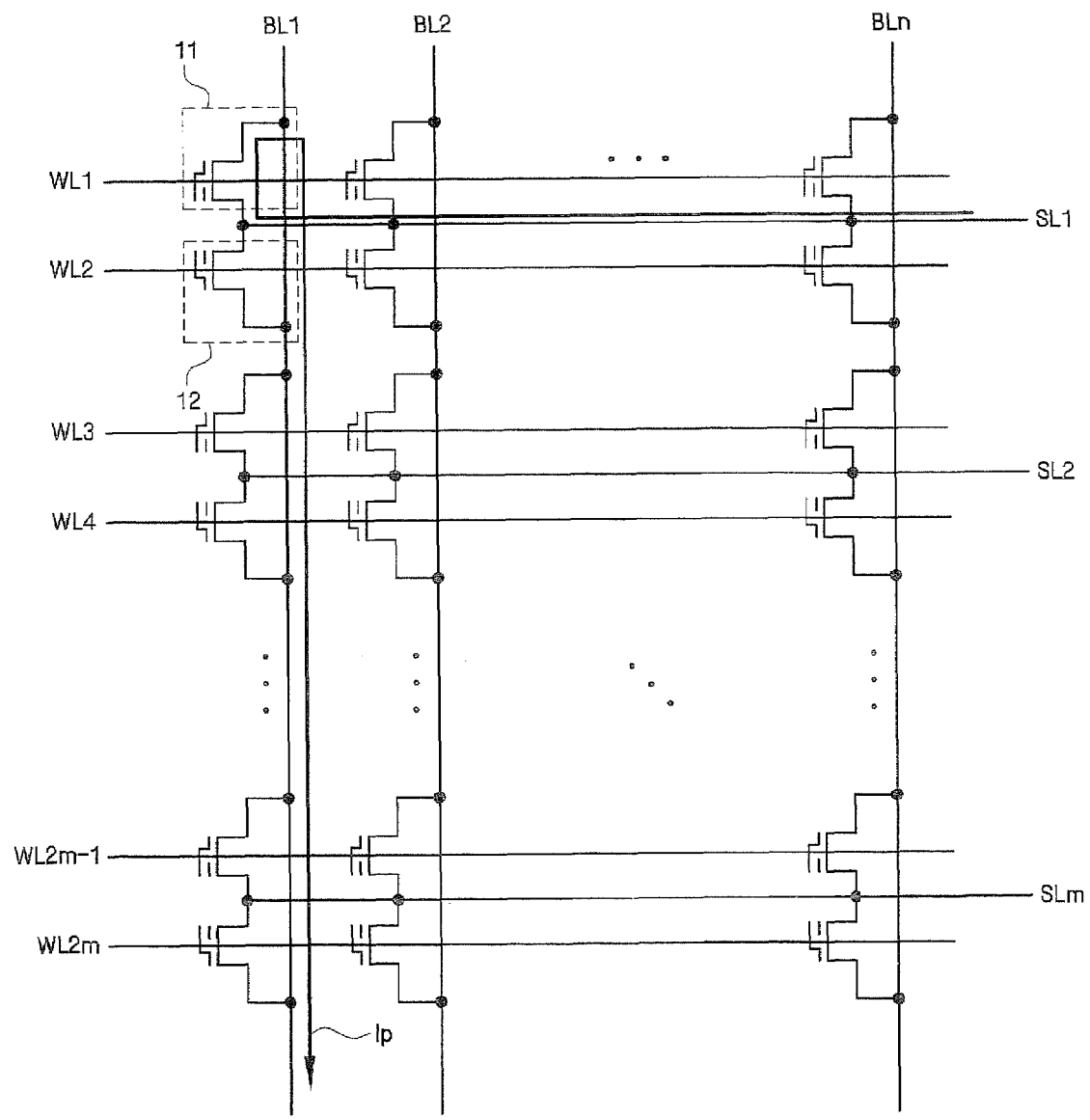
FIG. 2 is a circuit diagram illustrating a flash memory cell array of the device of FIG. 1 according to some embodiments of the present invention.

FIG. 1 is a block diagram illustrating a flash memory device according to some embodiments of the present invention. FIG. 2 is a circuit diagram illustrating a flash memory cell array of the device of FIG. 1.

Referring to FIGS. 1 and 2, a flash memory device 1 according to some embodiments of the present invention includes a flash memory cell array 10, a row decoder and word line driver 20, a source decoder and source line driver 30, an input driver 40, a program voltage generator circuit 50 and a program current compensation circuit 100, here shown as including a control circuit 60 and a current mirror circuit 70, coupled to the output of the program voltage generator circuit 50. The flash memory cell array 10 includes a plurality of flash memory cells 11 and 12 that are defined in regions where a plurality of word lines WL1-WL2m, a plurality of source lines SL1-SLm, and a plurality of bit lines BL1-BLn cross. Specifically, gates of the respective flash memory cells 11 and 12 are coupled to the word lines WL1-WL2m, sources of the respective flash memory cells 11 and 12 are coupled to the source lines SL1-SLm, and drains of the respective flash memory cells 11 and 12 are coupled to the bit lines BL1-BLn. In particular, two adjacent flash memory cells 11 and 12 (that is, flash memory cells disposed in a vertical direction in FIG. 2), which are respectively coupled to different word line (for example, WL1 and WL2) and the same bit line (for example, BL1), can share a source. The flash memory cells 11 and 12 according to embodiments of the present invention may be split gate flash memory cells, but are not limited thereto, e.g., the flash memory cells 11 and 12 may be stack flash memory cells.

The row decoder and word line driver 20, the source decoder and input driver 30, the input driver 40 may serve as components of a program circuit that allows a program current Ip to flow through a plurality of relevant flash memory cells 11 and 12 when programming is performed. The row decoder and word line driver 20 decodes row addresses RA1-RAx-1, and selects corresponding word lines WL1-WL2m. The source decoder and source line driver 30 decode the row addresses RA1-RAx-1 other than a least significant one bit among the row addresses RA1-RAx-1, and selects the corresponding source lines SL1-SLm. The input driver 40 adjusts a voltage level of each of the plurality of bit lines BL1-BLn in response to the plurality of input data DIN1-DINn when programming is performed.

TABLE 1

| Operation | Selection/ Non-Selection | Word Line | Source Line | Bit Line |
|---|---|---|---|---|
| Program | Selection | Vt (about 1 V) | Vpp (about 10 V) | About 0.4 V |
|  | Non-Selection | Vss | Vss | Vcc |

Referring to Table 1, the row decoder and word line driver 20 applies a threshold voltage Vt (e.g., about 1.5 V) to the selected flash memory cells 11 and 12 and the coupled word lines WL1-WL2m, and the source decoder and source line driver 30 applies a program voltage Vpp (e.g., about 10 V) to the source lines SL1-SLm. The program voltage Vpp may be generated by the program voltage generator circuit 50, which may be, for example, a charge pump.

If the input data DIN1-DINn are at a high level, the input driver 40 applies a write inhibiting voltage (similar to a power supply voltage (Vcc)) to the bit lines BL1-BLn such that the corresponding flash memory cells 11 and 12 are not programmed (write data 1). If the input data DIN1-NINn are at a low level, the input driver 40 applies a predetermined voltage (e.g., about 0.4 V) to the bit lines BL1-BLn such that the corresponding flash memory cells are programmed (write 0). A program current Ip flows from the source lines SL1-SLm at the program voltage Vpp to the bit lines BL1-BLn at the predetermined voltage (e.g., about 0.4 V). Meanwhile, the row decoder and word line driver 20 applies a ground voltage Vss to the non-selected word lines WL1-WL2m, and the source decoder and source line driver 30 applies the ground voltage Vss to the non-selected source lines SL1-SLm. The voltage levels illustrated in Table 1 are only exemplary, and the present invention is not limited thereto.

In each operation, the number of flash memory cells that are simultaneously programmed is different. That is, if all of the plurality of input data DIN1-DINn are at the low level, all of the selected flash memory cells 11 and 12 are programmed, but if all of the plurality of input data DIN1-DINn are at high levels, none of the selected flash memory cells 11 and 12 are programmed. If the number of flash memory cells 11 and 12 to be simultaneously programmed is large, a total program current flowing through the flash memory cells 11 and 12 may become relatively large, which may drastically lower the voltage level of the program voltage Vpp applied to the source lines SL1-SLm. As a result, program efficiency may deteriorate.

If the voltage level of the program voltage Vpp is increased to counteract for a the maximum total program current, a disturb phenomenon may occur in which adjacent split gate flash memory cells 11 and 12 opposite to each other in respect to the source lines SL1-SLm are programmed even when they should not be programmed. This may occur when the number of flash memory cells 11 and 12 to be simultaneously programmed is small (for example, one or two), which may not significantly lower the program voltage Vpp, and the adjacent split gate flash memory cells 11 and 12 may be affected by relatively high level of the program voltage Vpp.

In some embodiments of the present invention, the program current compensation circuit 100, here shown as including the control circuit 60 and the current mirror circuit 70, is provided, and the voltage level of the program voltage may be stably maintained regardless of the number of flash memory cells to be simultaneously programmed. In the illustrated embodiments, the control circuit 60 includes a plurality of dummy program current generating elements through which the dummy program current flows in response to the plurality of input data DIN1-DINn at the time of programming. In this case, the amount of dummy program current that flows through one dummy program current generating element may be the same as that of the program current Ip flowing through the above-mentioned flash memory cells 11 and 12. The number of plurality of dummy program current generating elements may be the same as that of the plurality of input data DIN1-DINn.

TABLE 2

| Type of Input Data | Number of Program Currents | Number of Dummy Program Currents | Total Number of Program Currents |
|---|---|---|---|
| One data is 0 | 1 | n − 1 | n |
| All data is 1 | 0 | N | n |
| All data is 0 | N | 0 | n |

For example, as shown in Table 2, if only one input data of the plurality of input data DIN1-DINn is a low level (only one of the plurality input data is 0), one program current Ip flows through only one of the flash memory cells 11 and 12, but (n−1) dummy program currents complementarily flow through the control circuit 60. If all of the plurality of input data DIN1-DINn are high levels (all of them are 1), the program current Ip does not flow through the flash memory cell array 10, but n dummy program currents complementarily through the control circuit 60. If all of the plurality of input data DIN1-DINn are low levels (all of them are 0), n program currents Ip flow through the flash memory cell array 10, but the dummy program current does not complementarily flow through the control circuit 60. Further, the program current that has the same current amount as the total current of the plurality of dummy program currents flows through the current mirror circuit 70.

As a result, the sum between the program current Ip flowing through the flash memory cell array 10 and the program current flowing through the current mirror circuit 70 when the programming is performed may be maintained substantially constant. Therefore, the voltage level of the program voltage Vpp may be maintained substantially constant regardless of the number of the flash memory cells 11 and 12 that are simultaneously programmed. Further, because the voltage level of the program voltage Vpp can be maintained substantially constant, it is possible to reduce the disturbance phenomenon that may occur when the program voltage is increased, that is, the disturbance phenomenon in which the adjacent flash memory cells 11 and 12 opposite to each other in respect to the source lines SL1-SLm are programmed when they should not be programmed.

Figure 3:
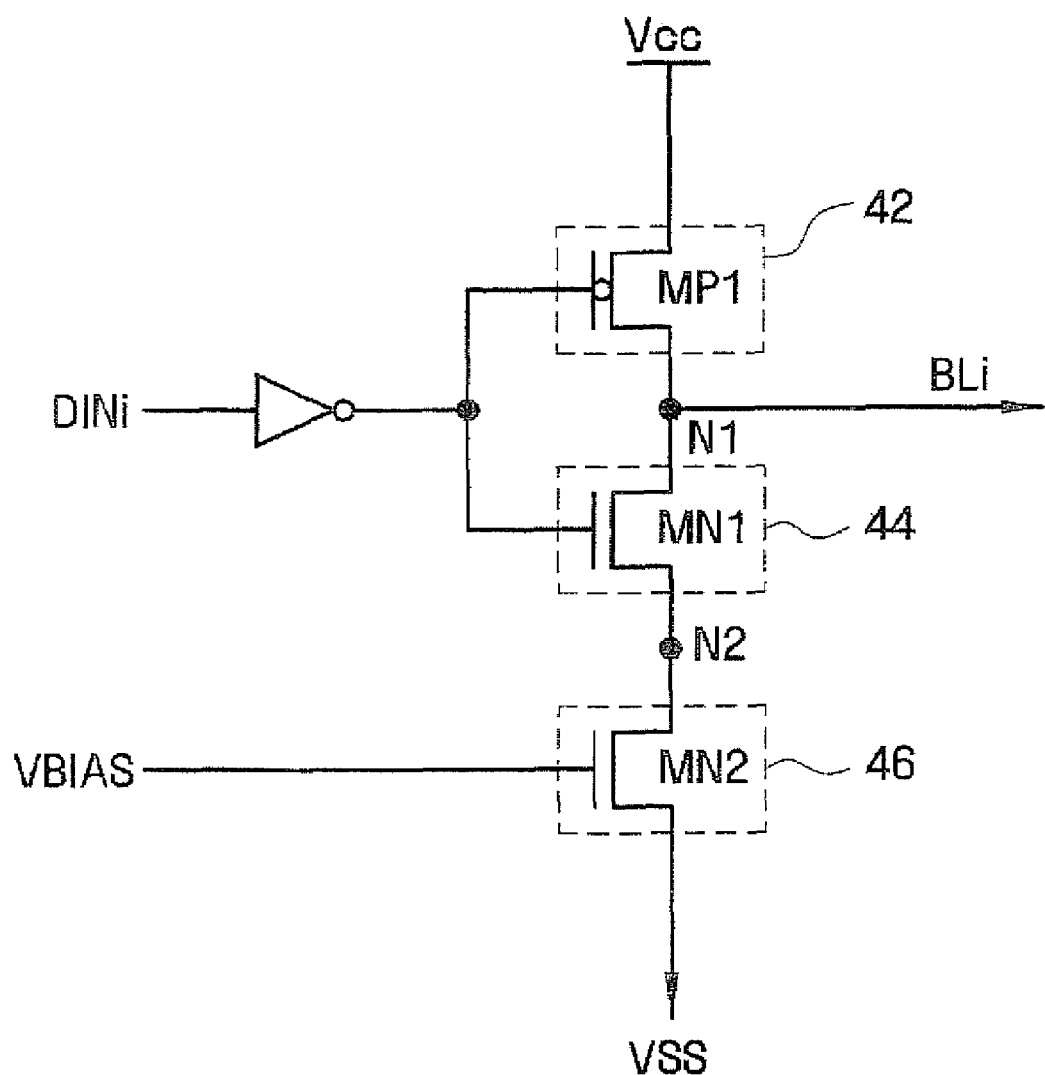
FIG. 3 is a circuit diagram illustrating an input driver of the device of FIG. 1 according to some embodiments of the present invention.

FIG. 3 is a circuit diagram illustrating an input driver for the device FIG. 1 according to some embodiments of the present invention. Referring to FIG. 3, the input driver 40 includes a pull up element 42, a pull down element 44, and a first load element 46 that are coupled in series between the power supply voltage Vcc and the ground voltage Vss. Specifically, the pull up element 42 is a PMOS transistor MP1 that is coupled between the power supply voltage Vcc and the first node N1 and operates in response to an inversion signal of the input data DINi. The pull down element 44 is an NMOS transistor MN1 that is coupled between the first node N1 and the second node N2 and operates in response to an inversion signal of the input data DINi. The first load element 46 may be an NMOS transistor that is coupled between the second node N2 and the ground voltage Vss and whose gate is applied with a predetermined bias voltage VBIAS. The resistance of the NMOS transistor MN2 varies according to the amplitude of the bias voltage VBIAS. As a result, the amount of program current that flows through the flash memory cell coupled to the input driver 40 may be adjusted.

The operation of the input driver 40 will now be described. If the input data DINi of the high level is applied, the PMOS transistor is turned on, and the power supply voltage Vcc is applied to the bit line BLi. Further, if the input data DINi of the low level is applied, the NMOS transistor MN1 is turned on, and a predetermined voltage (e.g., about 0.4 V) corresponding to the bias voltage VBIAS is applied to the bit line BLi.

Figure 4:
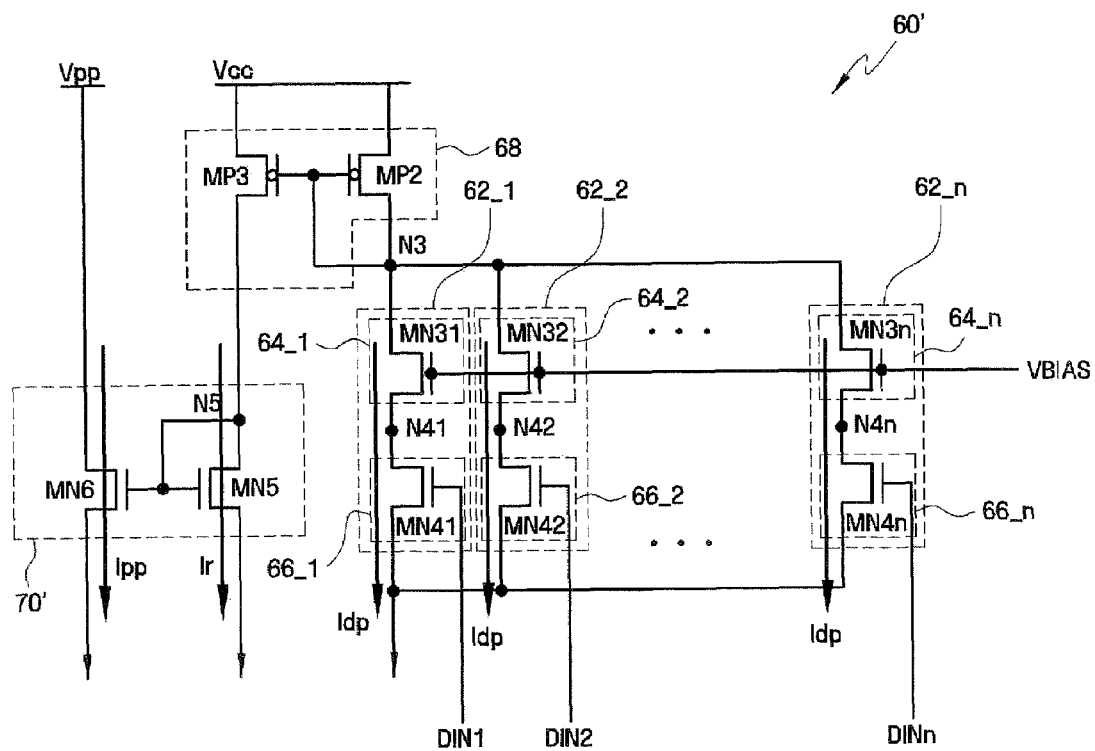
FIG. 4 is a circuit diagram illustrating a control circuit and a current mirror circuit for the device FIG. 1 according to some embodiments of the present invention.

Exemplary circuit implementations of a control circuit 60' and a current mirror circuit 70' will now be described below with reference to FIGS. 4 to 6. Referring to FIG. 4, the control circuit 60' includes a plurality of dummy program generating elements 62_1-62_n that are coupled between the third node N3 and the ground voltage Vss, and a second current mirror circuit 68 that is controlled by a voltage level of the third node N3.

The plurality of dummy program generating elements 62_1-62_n include second load elements 64_1-64_n and switching elements 66_1-66_n that are serially coupled to one another. In the illustrated embodiments, the second load elements 64_1-64_n are NMOS transistors MN31-MN3n that are coupled between the third node N3 and the fourth nodes N41-N4n and whose gates are applied with a predetermined bias voltage VBIAS. The resistances of the NMOS transistors MN31-MN3n vary according to the amplitude of the bias voltage VBIAS, and thus the amount of the dummy program current Idp is adjusted. The amount of the dummy program current Idp is substantially the same as that of the program current that flows through the flash memory cell programmed in the flash memory cell array. The bias voltage VBIAS does not need to be the same as the bias voltage used in the input driver, and it may be sufficient if it is a bias voltage of a level capable of determining the dummy program current Idp. In this case, the second load elements 64_1-64_n are not limited to a specific type so long as they can determine the amount of the dummy program current Idp. For example, the second load element may be any one of a resistor, a bipolar transistor, or the like. The switching elements 66_1-66_n may be NMOS transistors MN41-MN4n that are coupled between the fourth nodes N41-N4n and the ground voltage Vss and gated in response to the input data DIN1-DINn.

The second current mirror 68 supplies a reference current Ir that has the same amount as the total current of the plurality of dummy program currents Idp. This second current mirror circuit 68 includes two PMOS transistors MP2 and MP3 that are gated in response to the voltage of the third node N3.

The current mirror circuit 70' supplies a program current Ipp having the same amount as the reference current Ir. Specifically, the current mirror circuit 70' includes two NMOS transistors MN5 and MN6 that are gated in response to a voltage of the fifth node N5.

Because the NMOS transistor MN6 is electrically coupled to the program voltage Vpp generated in the program voltage generator circuit 50 shown FIG. 1, it may be a high voltage transistor so as to endure stresses generated due to the program voltage Vpp. The high voltage transistor may have a thicker insulating film in comparison to a lower voltage transistor.

Because the other transistors MN31-MN3n, MN41-MN4n, NN5, MP2, and MP3 are not electrically coupled to the program voltage Vpp, non-high-voltage transistors may be used. Accordingly, according to some embodiments of the present invention, an area where the transistors are formed can be reduced.

Operation in a case in which input data DIN1 of a low level is one and input data DIN2-DINn of high levels are n−1 is as follows. The corresponding (n−1) switching elements 66_2-66_n are turned on in response to the input data DIN1-DINn of the high levels. Accordingly, (n−1) dummy program currents (that is, (n−1)×Idp) flow through the load elements MN32-MN3n. The reference current Ir that has the same amount as (n−1)×Idp flows through the second current mirror circuit 68. Then, the program current Ipp that has the same amount as the reference current Ir flows through the current mirror circuit 70'.

Figure 5:
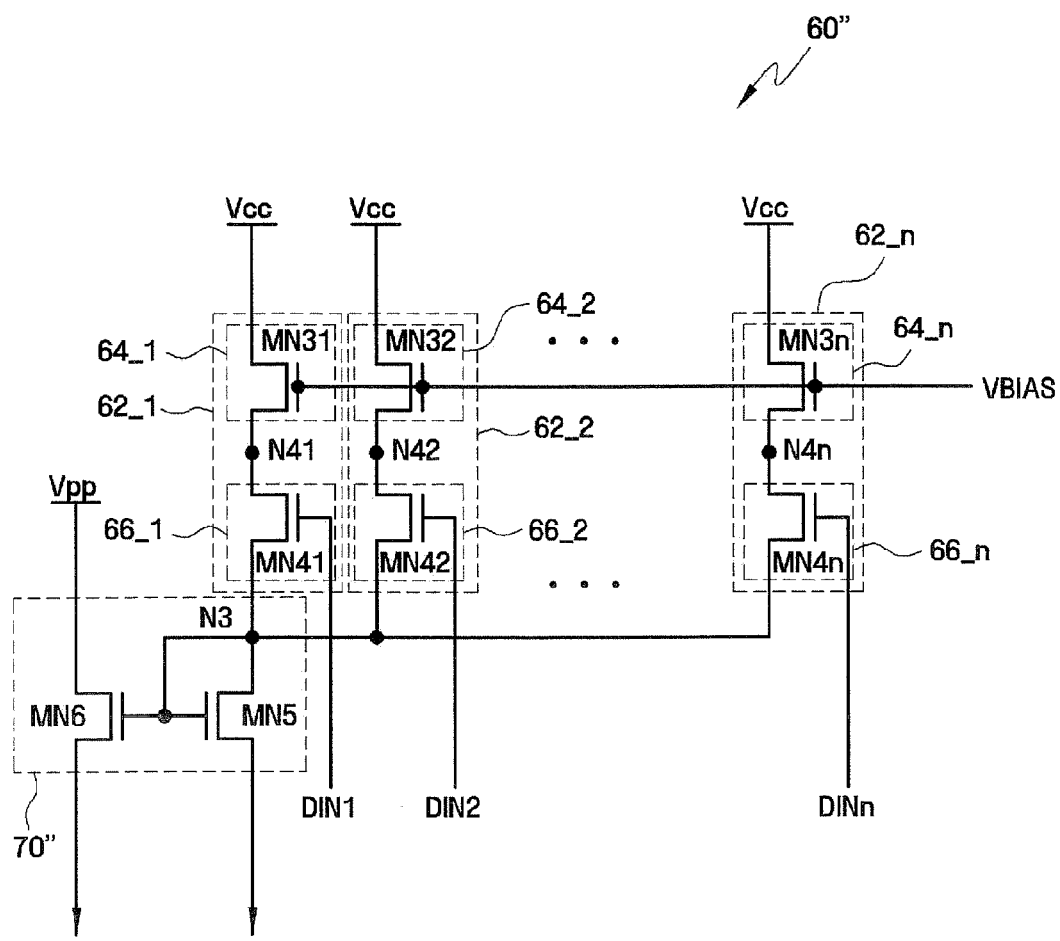
FIG. 5 is a circuit diagram illustrating a control circuit and a current mirror circuit for the device of FIG. 1 according to some embodiments of the present invention.

FIG. 5 is another circuit diagram illustrating a control circuit 60" and a current mirror circuit 70" for the device of FIG. 1 according to some embodiments of the present invention. In FIG. 5, the same constituent elements as those in FIG. 4 are denoted by the same reference numerals, and the detailed description thereof will be omitted.

Referring to FIG. 5, the plurality of dummy program current generating elements 62_1-62_n of the control circuit 60" are directly coupled to a current mirror circuit 70" without using a separate current mirror circuit (for example, the current mirror circuit 68 of FIG. 4). Accordingly, the plurality of dummy program current generating elements 62_1-62_n are electrically coupled to the power supply voltage Vec and the third node N3.

Figure 6:
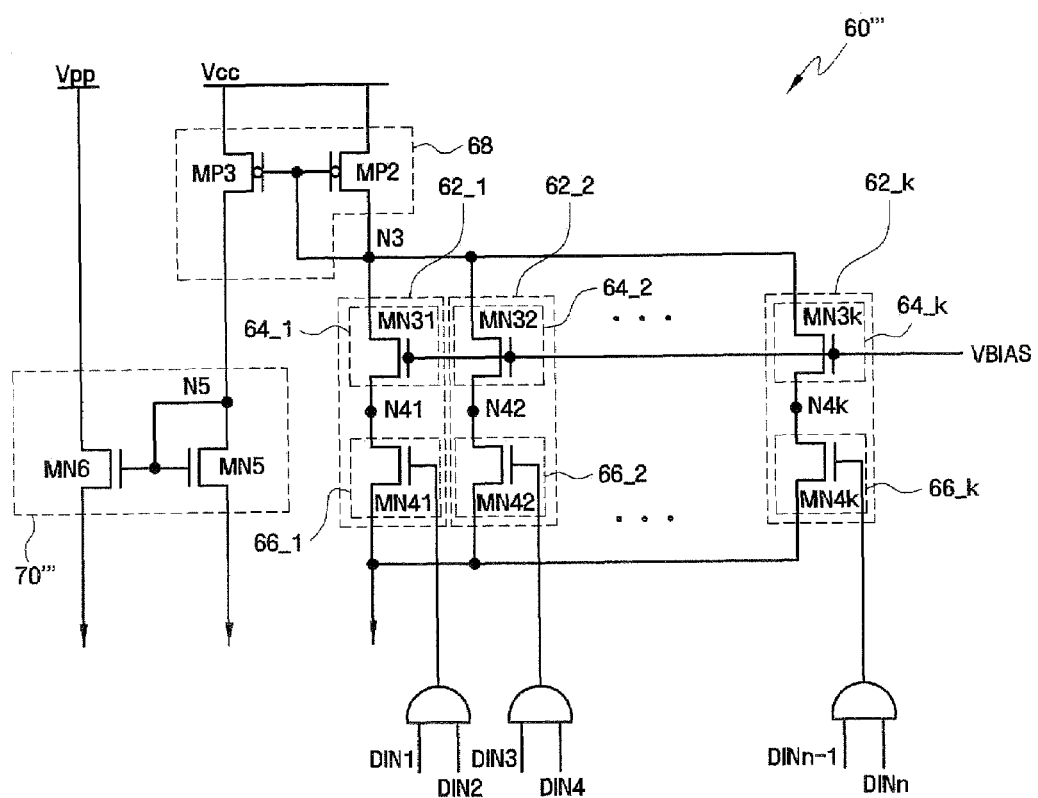
FIG. 6 is a circuit diagram illustrating a control circuit and a current mirror circuit for the device of FIG. 1 according to some embodiments of the present invention.

FIG. 6 is another circuit diagram illustrating a control circuit 60'" and a current mirror circuit 70'" for the device of FIG. 1 according to still further embodiments. In FIG. 6, the same constituent elements as those in FIG. 4 are denoted by the same reference numerals, and the detailed description thereof will be omitted.

Referring to FIG. 6, the respective switching elements 66_1-66_k of the control circuit 60'" may be turned on in response to the input data DIN1-DINn. For example, signal produced by ANDing two input data DIN1 and DIN2 or DIN3 and DIN4 or DIn-1 and DINn may be input to the respective switching elements 66_1-66_k. In FIG. 6, the AND operation signal is exemplified, but the present invention is not limited thereto. In these embodiments, a sum between the plurality of program currents and the program current is not constant regardless of the number of flash memory cells that are simultaneously programmed. This is because the dummy program current Idp flows only when the input data DIN1-DINn forming pairs simultaneously become high levels. In FIG. 6, a case in which the switching elements 66_1-66_k are turned on in response to the operation signal of the two input data has been exemplified, but the switching elements 66_1-66_k may be turned on in response to the operation signal of the three or more input data.

Figure 7A:
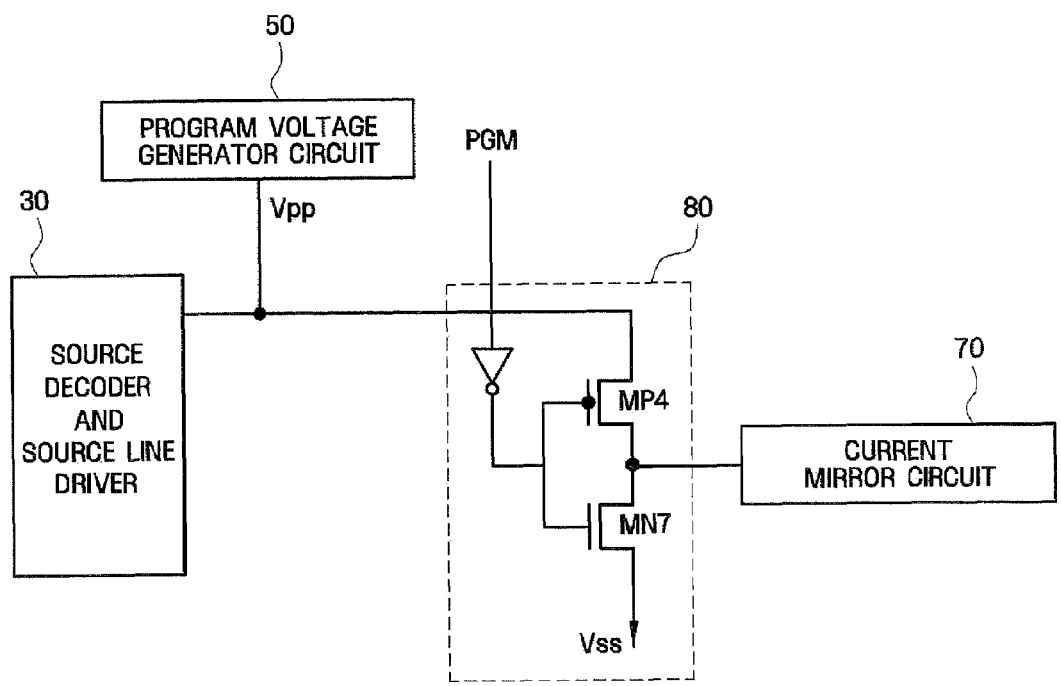
FIGS. 7A and 7B are circuit diagrams illustrating a program current compensation circuits according to some embodiments of the present invention.
Figure 7B:
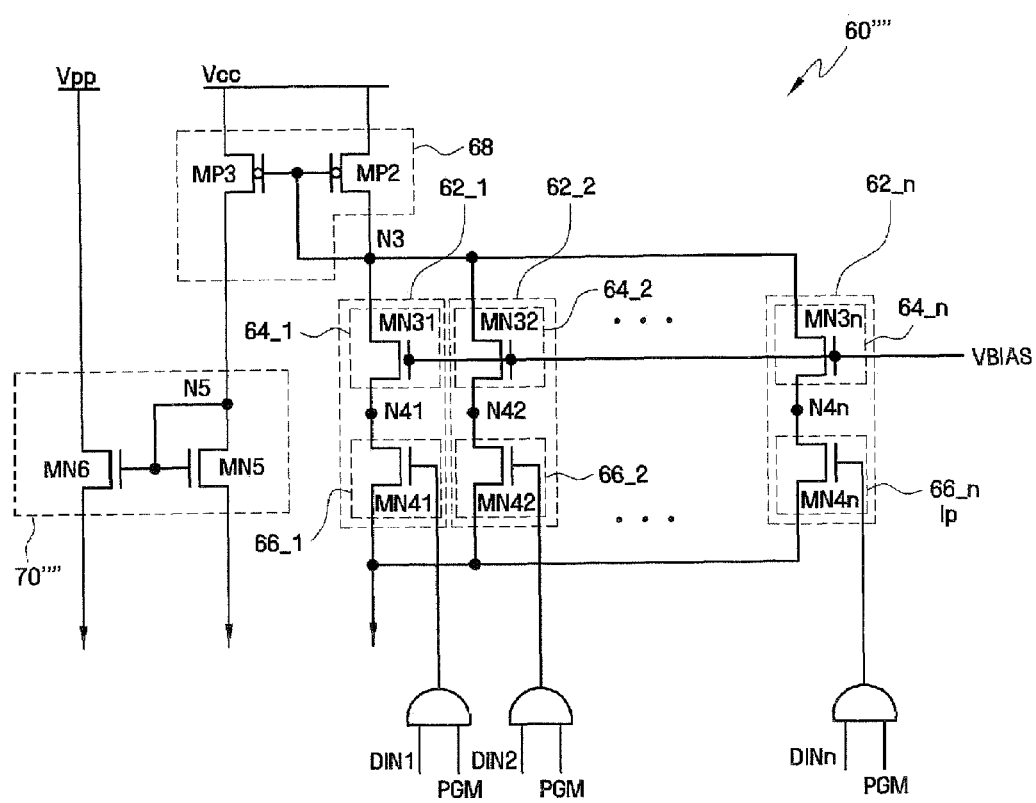

FIGS. 7A and 7B are diagrams illustrating program current compensation circuits for the device of FIG. 1 according to some embodiments of the present invention. In FIGS. 7A and 7B, the same constituent elements as those in FIG. 4 are denoted by the same reference numerals, and the detailed description thereof will be omitted.

Referring to FIGS. 7A and 7B, a control circuit and/or the current mirror circuit is constructed so as to operate only when programming is performed. Referring to FIG. 7A, a program instruction circuit 80 is coupled between the program voltage generator circuit 50 and the current mirror circuit 70, and selectively transmits the program voltage Vpp to the current mirror circuit 70 in response to a program enable signal PGM. Specifically, if the program enable signal PGM is at a high level, the PMOS transistor MP4 is turned on, and applies the program voltage Vpp to the current mirror circuit 70. If the program enable signal PGM is at a low level, the NMOS transistor MN7 is turned on, and applies the ground voltage Vss to the current mirror circuit 70. Referring to FIG. 7B, the respective switching elements 66_1-66_n of a control circuit 60"" coupled to a current mirror circuit 70"" may be turned on in response to AND operations on the input data DIN1-DINn and the program enable signal PGM.

For a device as shown in FIG. 4 with a number of dummy program current generating elements of 32, the voltage level of the program voltage was simulated using HSPICE while increasing the number of simultaneously programmed flash memory cells.

Figure 8:
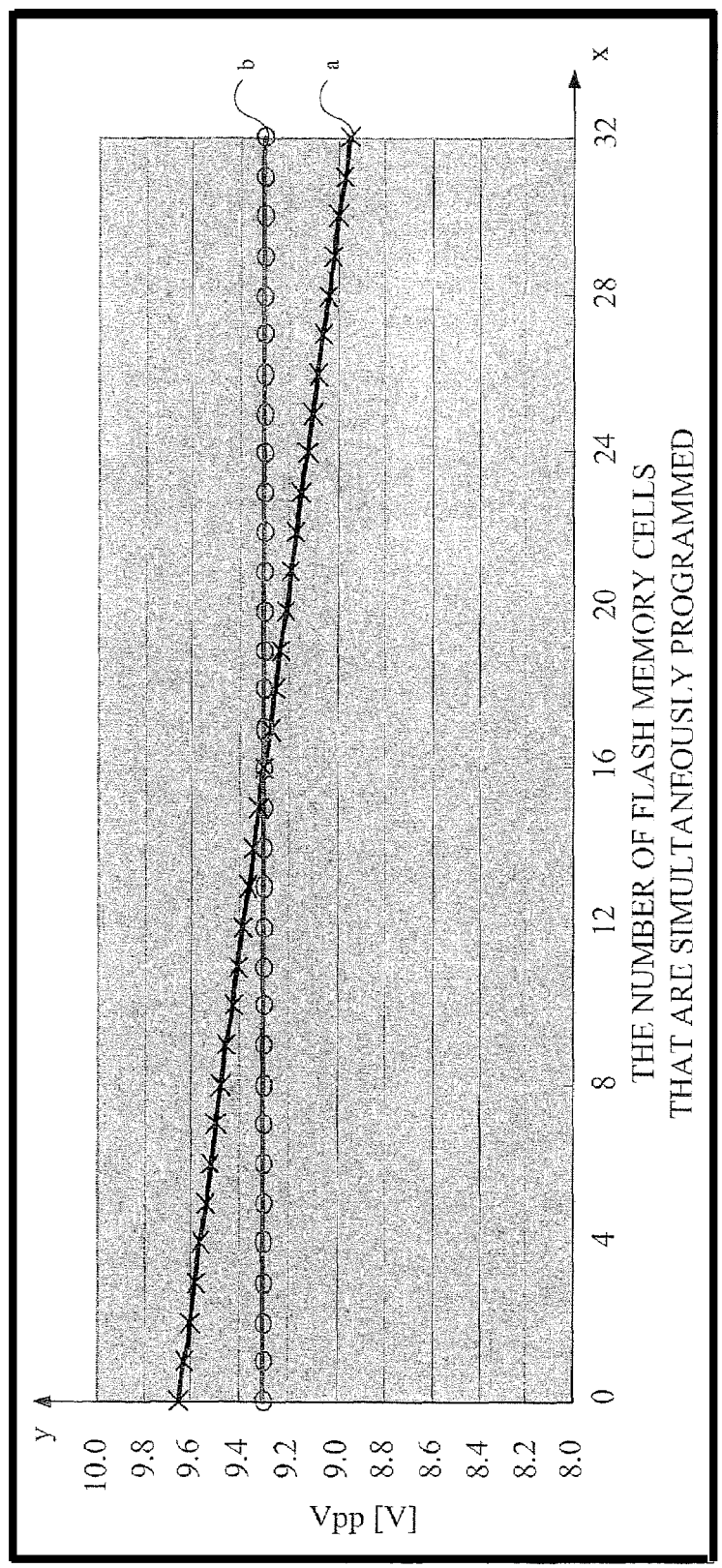
FIG. 8 is a graph illustrating a simulation of a voltage level of a program voltage while increasing the number of simultaneously programmed flash memory cells according to some embodiments of the present invention.

For a flash memory device in which program current compensation according to embodiments of the invention is not provided, the voltage level of the program voltage was simulated by using HSPICE while increasing the number of simultaneously programmed flash memory cells (curve a of FIG. 8). Referring to FIG. 8, an x-axis indicates the number of simultaneously programmed flash memory cells, and a y-axis indicates a voltage level of the program voltage Vpp.

From the simulated example, when the number of programmed flash memory cells is increased, the voltage level of the program voltage applied to the source lines are gradually lowered. Specifically, if the number of the programmed flash memory cells is 0, the voltage level of the program voltage is about 9.6 V, and if the number of the programmed flash memory cells is 32, the voltage level of the program voltage is about 9.0 V, i.e., there is a voltage difference of 0.6 V between the two cases. In contrast, from an example for a device according to embodiments of the present invention (curve b), the voltage level of the program voltage applied to the source lines is substantially constant regardless of the number of simultaneously programmed flash memory cells.

Flash memory devices according to embodiments of the present invention may provide several advantages. In some embodiments, because a control circuit and a program voltage generator circuit are coupled using a current mirror circuit, the control circuit can be fabricated with non-high-voltage transistors. Therefore, an area where transistors are formed can be reduced, as compared with a case in which the current mirror circuit is not used.

When the programming is performed, a sum of the program current flowing through the flash memory cell array and the program current flowing through the current mirror circuit may be kept relatively constant. That is, an amount of a program current consumed when programming is performed is constant. Therefore, the voltage level of the program voltage may be held substantially constant regardless of the number of the simultaneously programmed flash memory cells. Because the voltage level of the program voltage can be maintained relatively constant when the programming is performed, it is possible to reduce a disturb phenomenon.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims.

What is claimed is:

1. A memory device comprising:
   a flash memory cell array comprising a plurality of flash memory cells;
   a program voltage generator circuit configured to generate a program voltage at an output thereof;
   a program circuit coupled to the output of the program voltage generator circuit and configured to couple the output of the program voltage generator circuit to the memory cell array, wherein the memory cell array responsively loads the output of the program voltage generator circuit an amount that varies in correlation with data applied to the memory cell array; and
   a program current compensator circuit coupled to the output of the program voltage generator circuit and configured to load the program voltage generator circuit in correlation to the data applied to the memory cell array.

2. A memory device comprising:
   a flash memory cell array comprising a plurality of flash memory cells;
   a program voltage generator circuit configured to generate a program voltage at an output thereof;
   a program circuit coupled to the output of the program voltage generator circuit and configured to couple the output of the program voltage generator circuit to the memory cell array, wherein the memory cell array responsively loads the output of the program voltage generator circuit an amount that varies in correlation with data applied to the memory cell array; and
   a program current compensator circuit coupled to the output of the program voltage generator circuit and configured to load the program voltage generator circuit in correlation to the data applied to the memory cell array, wherein the program current compensator circuit comprises:
   a control circuit comprising a plurality of paralleled dummy load circuits that pass respective currents responsive to the applied data; and
   a current mirror circuit coupled to the output of the program voltage generator circuit and the control circuit and configured to draw a current from the program voltage generator circuit that mirrors a sum of the currents in the plurality of parallel dummy load circuits.

3. The device of claim 2:
   wherein the current mirror circuit comprises a first current mirror circuit having a first current path coupled to the output of the program voltage generator circuit; and wherein the control circuit comprises a second current mirror circuit having a first current path coupled in series with the plurality of paralleled dummy load circuits and a second current path coupled in series with a second current path of the first current mirror circuit.

4. The device of claim 2, wherein the current mirror circuit has a first current path coupled to the output of the program voltage generator circuit and a second current path coupled in series with the plurality of paralleled dummy load circuits.

5. The device of claim 2, wherein respective ones of the paralleled dummy load circuits are controlled responsive to respective data lines of the memory cell array.

6. The device of claim 2, wherein respective ones of the paralleled dummy load circuits are controlled responsive to respective pairs of data lines of the memory cell array.

7. The device of claim 2, wherein the paralleled dummy load circuits are configured to be enabled and disabled responsive to a program enable signal.

8. The device of claim 2, further comprising a coupling circuit configured to couple and decouple the current mirror circuit to and from the output of the program voltage generator circuit responsive to a program enable signal.

9. The device of claim 2, further comprising a coupling circuit configured to couple and decouple the program current compensator circuit to and from the program voltage generator circuit responsive to a program enable signal.

10. The device of claim 2, wherein a respective one of the dummy load circuits comprises a respective series combination of a load and a switch.

11. The device of claim 10, wherein the load comprises a transistor having a gate electrode configured to receive a bias voltage that determines a resistance of the load.

12. The device of claim 10, wherein the load and switch comprise first and second NMOS transistors.

13. The device of claim 2, wherein the paralleled dummy load circuits are configured to pass current from a power supply node having a voltage less than a voltage produced by the program voltage generator circuit.

14. The device of claim 1, wherein the program current compensator circuit is configured to provide a load at the output of the program voltage generator circuit that is complementary to a load provided by the program circuit.

15. The device of claim 14, wherein the program current compensator circuit is configured to maintain a current drawn from the output of the program voltage generator circuit substantially constant over a range of data applied to the memory cell array.

16. The device of claim 1, wherein the flash memory cells comprise floating gate transistors, wherein the program circuit is configured to apply the program voltage to source terminals of the floating gate transistors, and wherein data is applied to drain terminals of the floating gate transistors.

17. The device of claim 16, wherein the floating gate transistors comprise split-gate transistors.

18. A flash memory device comprising:
a flash memory cell array that has a plurality of flash memory cells, a program current flowing through each of the plurality of flash memory cells in response to input data;
a control circuit that has a plurality of dummy program current generating elements, each of dummy program currents having the same amount as the program current flowing through each of the plurality of dummy program current generating elements in response to the input data; and
a current mirror circuit that supplies a mirror program current, which has substantially the same amount as a current corresponding to a sum of the plurality of dummy program currents,
wherein a current corresponding to a sum of the plurality of program currents and the mirror program current is constant regardless of the number of flash memory cells to be simultaneously programmed.

19. The flash memory device of claim 18, wherein the dummy program current generating element has a load element and a switching element that are serially coupled to each other, the load element determining a amount of the dummy program current, the switching element operating in response to the input data.

20. A flash memory device comprising:
a flash memory cell array that has a plurality of flash memory cells defined in regions where word lines, source lines, and bit lines cross one another, each of the plurality of flash memory cells having a gate coupled to the word line, a drain coupled to the bit line, and a source coupled to the source line;
a program circuit that allows a plurality of program currents to flow from the source lines applied with a program voltage to the bit lines, in response to a plurality of input data;
a control circuit that has a plurality of dummy program current generating elements through which a plurality of dummy program currents flow in response to the plurality of input data; and
a current mirror circuit that is electrically coupled to the program voltage, and supplies a mirror program current, which has substantially the same amount as a current corresponding to a sum of the plurality of dummy program currents.

21. The flash memory device of claim 20, wherein the dummy program current generating elements has a second load element and a switching element that are coupled in serial to each other, the second load element determining a amount of the dummy program current, and the switching element operating in response to the input data.

22. The flash memory device of claim 20, wherein the control circuit and/or the current mirror circuit is enabled only when a program operates.

* * * * *